(12) United States Patent
Yang et al.

(10) Patent No.: US 11,583,848 B2
(45) Date of Patent: Feb. 21, 2023

(54) NANOPARTICLE CONTROL AND DETECTION SYSTEM AND OPERATING METHOD THEREOF

(71) Applicant: Chang Gung University, Taoyuan (TW)

(72) Inventors: Chia-Ming Yang, New Taipei (TW); Chao-Sung Lai, Taoyuan (TW); Yu-Ping Chen, New Taipei (TW); Min-Hsien Wu, Taoyuan (TW)

(73) Assignee: CHANG GUNG UNIVERSITY, Taoyuan (TW)

( * ) Notice: Subject to any disclaimer, the term of this patent is extended or adjusted under 35 U.S.C. 154(b) by 468 days.

(21) Appl. No.: 16/560,958

(22) Filed: Sep. 4, 2019

(65) Prior Publication Data

US 2021/0016267 A1 Jan. 21, 2021

(30) Foreign Application Priority Data

Jul. 15, 2019 (TW) .................. 108124825

(51) Int. Cl.
*B01L 3/00* (2006.01)
*H01L 31/0376* (2006.01)
(Continued)

(52) U.S. Cl.
CPC .............. *B01L 3/502* (2013.01); *B03C 5/005* (2013.01); *B82B 3/0076* (2013.01); *G01N 27/44756* (2013.01); *H01L 31/02016* (2013.01); *H01L 31/022475* (2013.01); *H01L 31/03762* (2013.01); *H01L 31/095* (2013.01); *B01L 2200/0647* (2013.01); *B01L 2300/0645* (2013.01); *B01L 2300/0654* (2013.01); *B01L 2300/12* (2013.01); *B01L 2300/168* (2013.01);
(Continued)

(58) Field of Classification Search
None
See application file for complete search history.

(56) References Cited

U.S. PATENT DOCUMENTS 9,079,189 B2 7/2015 Garcia et al.
2012/0118740 A1* 5/2012 Garcia .................. G01N 15/00
204/547

(Continued)

FOREIGN PATENT DOCUMENTS

TW 201726540 A 8/2017

OTHER PUBLICATIONS

Yu-Ping Chen, Hsin-Yin Peng, Jia-Long Hong, Min-Hsien Wu, Chia-Ming Yang, "Magnetic Beads Actuating and Sensing by Light Addressability", Proceedings, Sep. 2018, pp. 1-4, MDPI.
(Continued)

*Primary Examiner* — J. Christopher Ball
(74) *Attorney, Agent, or Firm* — Cheng-Ju Chiang

(57) ABSTRACT

The present invention discloses a nanoparticle control and detection system and operating method thereof. The present invention controls and detects the nanoparticles in the same device. The device comprises a first transparent electrode, a photoconductive layer, a spacer which is deposed on the edge of the photoconductive layer and a second transparent electrode. The aforementioned device controls and detects the nanoparticles by applying AC/DC bias and AC/DC light source to the transparent electrode.

8 Claims, 6 Drawing Sheets

(51) Int. Cl.
*H01L 31/09* (2006.01)
*H01L 31/02* (2006.01)
*B82B 3/00* (2006.01)
*G01N 27/447* (2006.01)
*B03C 5/00* (2006.01)
*H01L 31/0224* (2006.01)
*B82Y 40/00* (2011.01)

(52) U.S. Cl.
CPC ....... *B01L 2400/0424* (2013.01); *B82Y 40/00* (2013.01)

(56) References Cited

U.S. PATENT DOCUMENTS

2012/0325665 A1* 12/2012 Chiou .................... B03C 5/026 977/734
2020/0094264 A1* 3/2020 Wheeler ................ G01N 15/10

OTHER PUBLICATIONS

Yu-Ping Chen, Hsin-Yin Peng, Jia-Long Hong, Min-Hsien Wu, Chia-Ming Yang, "Magnetic Beads Actuating and Sensing by Light Addressability", Proceedings, Feb. 2018, pp. 1-4, MDPI, Basel, Switzerland.

Shih-Mo Yang, Punde Tushar Harishchandra, Tung-Ming Yu, Ming-Huei Liu, Long Hsu, Cheng-Hsien Liu, "Concentration of Magnetic Beads Utilizing Light-Induced Electro-Osmosis Flow", IEEE Transactions on Magnetics, Oct. 2011, pp. 2418-2421, vol. 47, Issue No. 10, IEEE.

* cited by examiner

NANOPARTICLE CONTROL AND DETECTION SYSTEM AND OPERATING METHOD THEREOF

CROSS REFERENCE TO PRIOR DISCLOSURE AND RELATED APPLICATION

The present invention is related to a published disclosure entitled as "Magnetic Beads Actuating and Sensing by Light Addressability" in the journal of "Proceedings" by MDPI, presented publicly as earliest as Sep. 9, 2018. The above mentioned published disclosure is made by or obtained directly or indirectly from the named inventor(s) or joint inventor(s). Entire disclosure of the above mentioned published disclosure is incorporated by reference herein. The present invention also claims benefit of Taiwan Application No. 108124825, filed on Jul. 15, 2019, the disclosure of which is incorporated by reference herein.

TECHNICAL FIELD

The present invention relates to a nanoparticle control measurement system and its operation method, and more particularly, this nanoparticle control and detection system and operating method thereof which can be switched to control mode or detection mode in the same system according to requirement by applying AC/DC bias and AC/DC signal light source on transparent electrode.

BACKGROUND OF RELATED ARTS

With the progress of science and technology, the technology of biochemistry or medical detection is also constantly improving. The various related detections, they often involved in the detection of specific substances in a group of materials, which the amount of reaction or content is included.

The application of nanoparticles is also an important part of this technology, because of the different needs of the samples collected by nanoparticles for the final detection results in different chemical reactions or biomass reactions.

Therefore, before further optical detection, it is often necessary to collect or move nanoparticles through various technical means. Common methods include the use of centrifugal force, magnetic force, light control or capillary force.

Optically-induced dielectrophoresis (ODEP) system is inevitably used to control the movement of nanoparticles in a solution system. The operation technique of the system is to make the photoconductive layer produce different impedance values through light irradiating, and then manipulate the movement effect of nanoparticles in the system due to the change of electric field. However, this method only collects nanoparticles in a fixed place. It needs to move the collected samples to the detection platform to carry out the next detection operation. In this carrying process, physical collisions or other possible factors may happen and cause the well-collected nanoparticles leaving the collection area, and thus the subsequent detection operation is inaccurate.

In addition, the transfer step may be happened between different platforms. However, the compatibility gap between different platforms will also be a problem which needs to be considered. Therefore, this gap and the way of poor efficiency need to be improved.

SUMMARY

To resolve the drawbacks of the prior arts, the present invention discloses a nanoparticle control and detection system which includes a first transparent electrode, a photoconductive layer, a spacer, a second transparent electrode, a lens, a pattern light source, a bias power supply control system and an optical signal power supply control system.

The photoconductive layer is arranged on the first transparent electrode, and the spacer is arranged along the periphery of the photoconductive layer to form a reaction space. The second transparent electrode is arranged on the spacer, and the lens is arranged under the first transparent electrode. The pattern light source is arranged under the lens so that the lens is located between the pattern light source and the first transparent electrode.

The bias power supply control system is connected with the first transparent electrode and the second transparent electrode, while the optical signal power supply control system is connected with the pattern light source.

According yet another aspect, the present invention discloses an operation method of a nanoparticle control and detection system, comprising: providing a nanoparticle control and detection system; placing a reaction solution and a plurality of nanoparticles into a reaction space; utilizing a bias power supply control system to apply to an alternating current bias voltage to the first transparent electrode and the second transparent electrode; and utilizing a optical signal power supply control system to apply a direct current voltage to a pattern light source so that the pattern light source emits a direct current light source.

The method further comprises controlling an emitting direction of the direct current light source by the pattern light source to illuminates the optical conductivity layer and control the plurality of nanoparticles moving to a predetermined position or area, followed by turning off the alternating current bias voltage; and attaching the plurality of nanoparticles to the photoconductive layer.

The method further comprises and utilizing the bias power supply control system to apply a direct current bias to the first transparent electrode and the second transparent electrode; utilizing the optical signal power supply control system to apply an alternating current to the pattern light source so that the pattern light source emits an alternating current light source; and utilizing the alternating current light source to control a direction through the pattern light source to irradiate the photoconductive layer and the plurality of nanoparticles, and a detection data is read by a master control system.

Embodiments of the invention are illustrated by way of example, and not by way of limitation, in the FIGS. of the accompanying drawings in which like reference numerals refer to similar elements.

DETAILED DESCRIPTION OF THE INVENTION

In order to understand the technical features and practical efficacy of the present invention and to implement it in accordance with the contents of the specification, hereinafter, preferred embodiments of the present invention will be described in detail with reference to the accompanying drawings.

Figure 2:
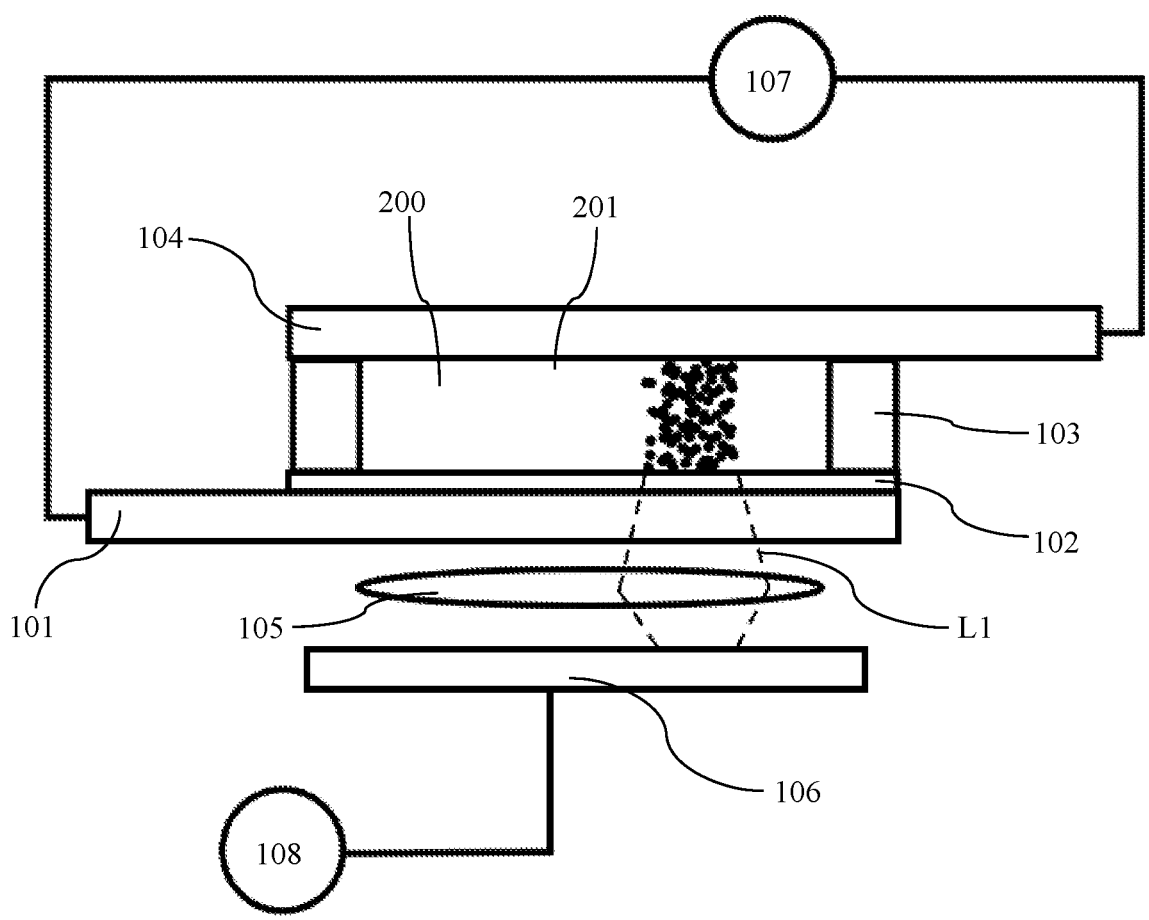
FIG. 2 illustrates a system architecture diagram of nanoparticles aggregation in an embodiment of the invention.

As shown in FIG. 2, it illustrates a nanoparticle control and detection system 10 provided in an embodiment of the present invention. FIG. 2 shows a system architecture diagram of nanoparticles aggregation in an embodiment of the present invention. The nanoparticle control and detection system 10 of the embodiment can be seen in FIG. 2 includes a first transparent electrode 101, a photoconductive layer 102, a spacer 103, a second transparent electrode 104, a lens 105, a pattern light source 106, a bias power supply control system 107 and an optical signal power supply control system 108.

The photoconductive layer 102 is arranged on the first transparent electrode 101, and the spacer 103 is arranged along the periphery of the photoconductive layer 102 to form a reaction space 200. The second transparent electrode 104 is arranged on the spacer 103. In this embodiment, the first transparent electrode 101 and the second transparent electrode 104 are made of Indium Tin Oxide (ITO). According to the concept of the present invention, materials of the first transparent electrode 101 and the second transparent electrode 104 may be applicable transparent conductive materials.

The lens 105 is arranged under the first transparent electrode 101, and the pattern light source 106 is arranged under the lens 105, so that the lens 105 is located between the pattern light source 106 and the first transparent electrode 101. The bias power supply control system 107 is connected with the first transparent electrode and the second transparent electrode, while the optical signal power supply control system 108 is connected with the pattern light source 106. In the present embodiment, the pattern light source 106 system is a light-emitting panel which can adjust the position or shape of its emitting light. In other embodiments, it can also be a light-emitting panel constructed by a plural of light source arrays. Therefore, the pattern light source 106 can control the position or pattern of the light emitted by the pattern light source 106, thereby controlling the position or shape of the illuminating area. In this embodiment, the position and pattern of the light emitted by the pattern light source element 106 are controlled by the optical signal power supply control system 108.

In the present embodiment, the reaction space 200 is used to be a simple reaction solution holding tank. However, the reaction space constructed by the structures of the first transparent electrode 101, the photoconductive layer 102, the spacer 103 and the second transparent electrode 104, such as a reaction tank, a flow channel or their combination in the biochemical detection instrument, may be included in the reaction space 200 defined by the present invention, and the present invention is not limited to this.

The photoconductive layer 102 used in this example is mainly used to sense signals generated by biological or chemical reactions. In this embodiment, the photoconductive layer 102 comprises a first amorphous silicon layer and a second amorphous silicon layer. The first amorphous silicon layer is arranged on the first transparent electrode 101 and the second amorphous silicon layer is arranged on the first amorphous silicon layer. Furthermore, the first amorphous silicon layer used in this embodiment is made of high concentration doped N-type hydrogenated amorphous silicon (n+a-Si:H). The second amorphous silicon layer is made of intrinsic hydrogenated amorphous silicon (Intrinsic a-Si:H).

Figure 5:
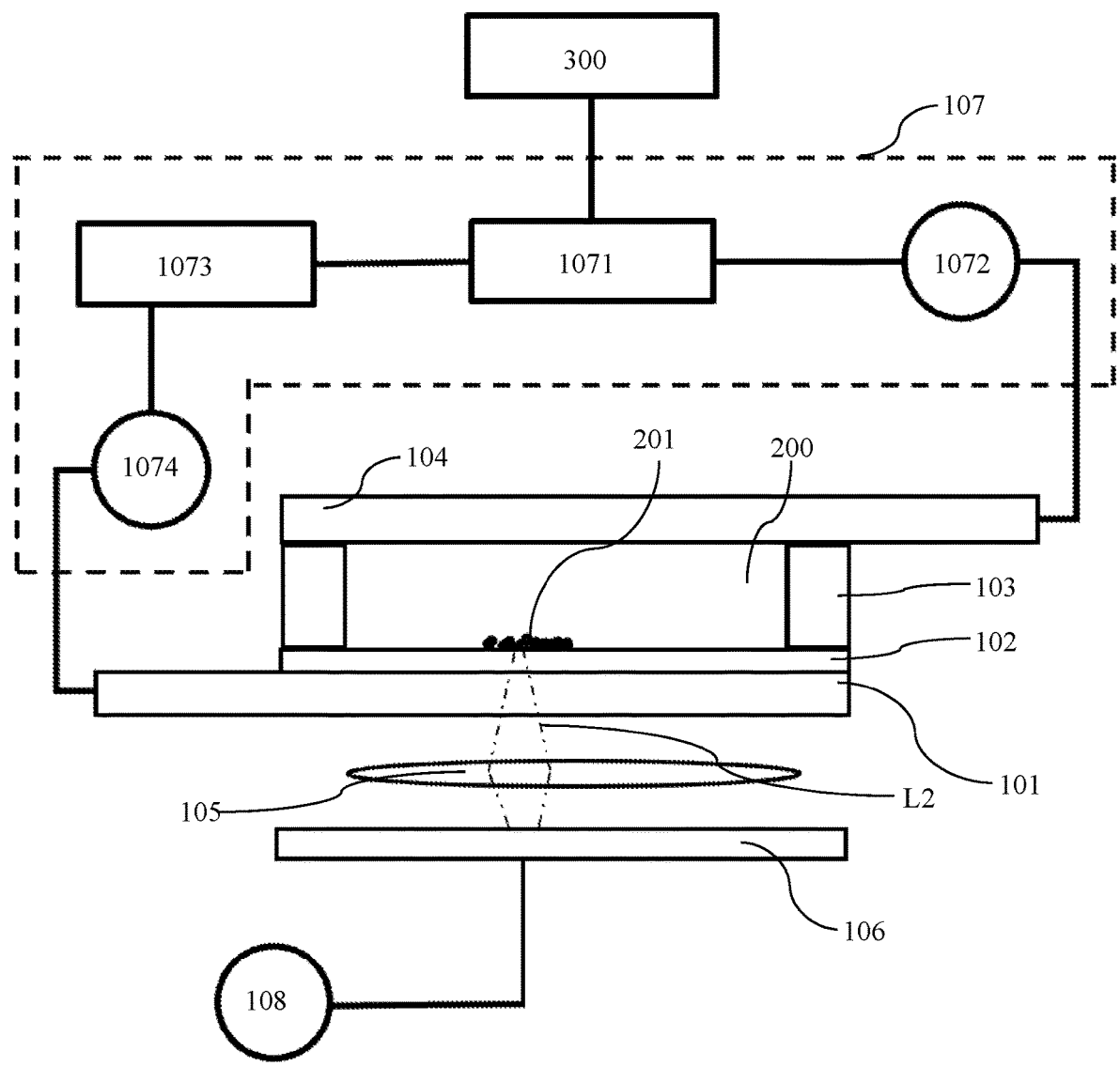
FIG. 5 illustrates a schematic diagram of the reaction result of nanoparticles detection according to one embodiment of the present invention.

Under the concept of the present invention, in other embodiments, the nanoparticle control and detection system 10 shown in FIG. 2 may include (or embed) the master control system 300 shown in FIG. 5. The master control system 300 disclosed in FIG. 5 can be selected from a single chip microcomputer, an industrial computer or a personal computer, or even a portable device with operation or recording functions. The present invention is not limited to such devices.

In this embodiment, the master control system 300 is connected to the bias power supply control system 107, the optical signal power control system 108 and an additional mounted microscope camera. Accordingly, the main control system 300 can be used to simultaneously control the bias power supply control system 107, the optical signal power control system 108 and the mounted microscopic camera to observe the movement of nanoparticles 201 in the reaction solution of the reaction space 200 in real time, and even to confirm whether the nanoparticles 201 have been moved to the correct reaction area.

Figure 1:
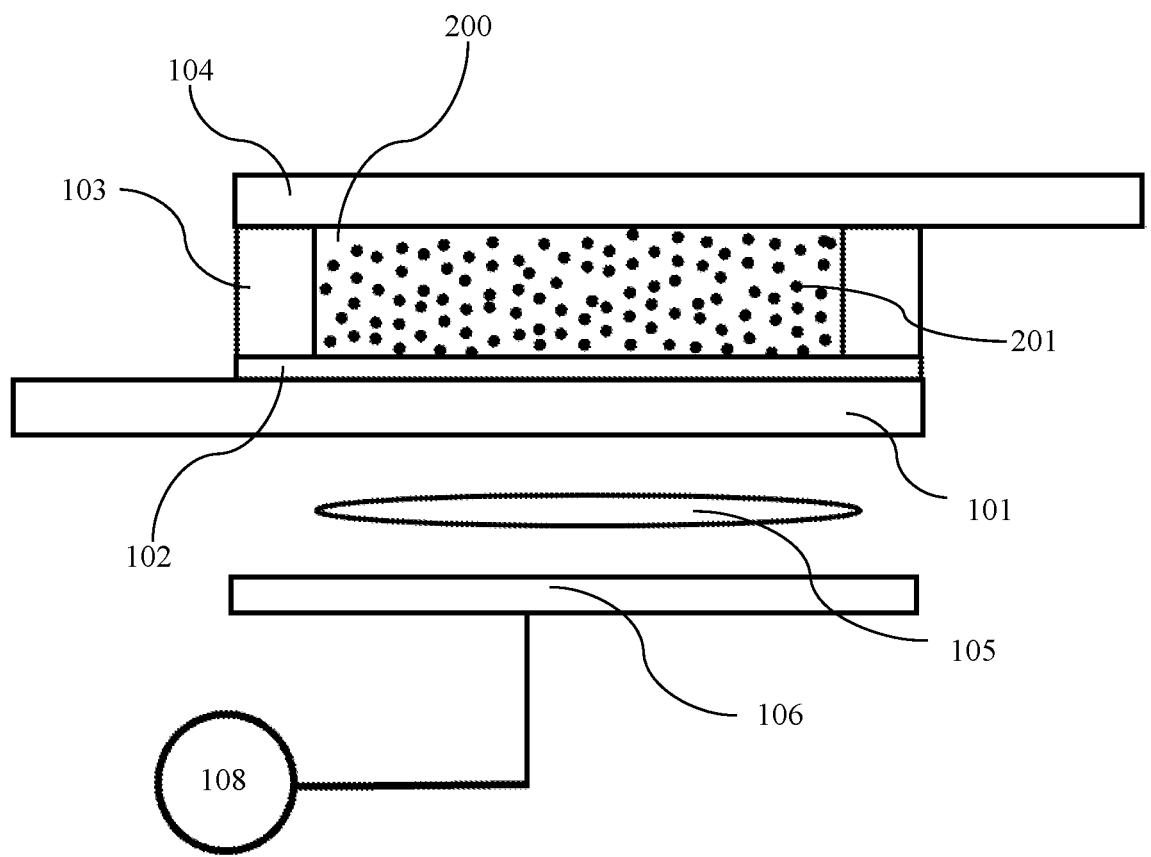
FIG. 1 illustrates a schematic diagram of the structure of placing nanoparticles in an embodiment of the invention.
Figure 3:
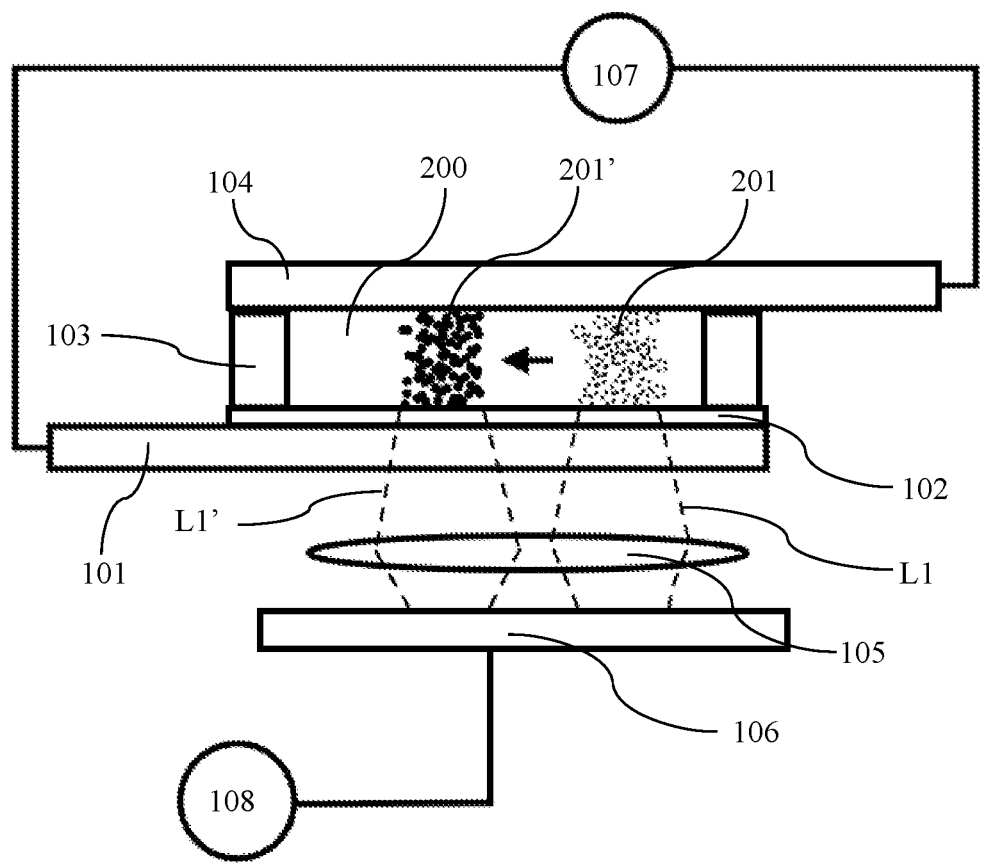
FIG. 3 illustrates a schematic diagram of nanoparticles movement in an embodiment of the invention.
Figure 4:
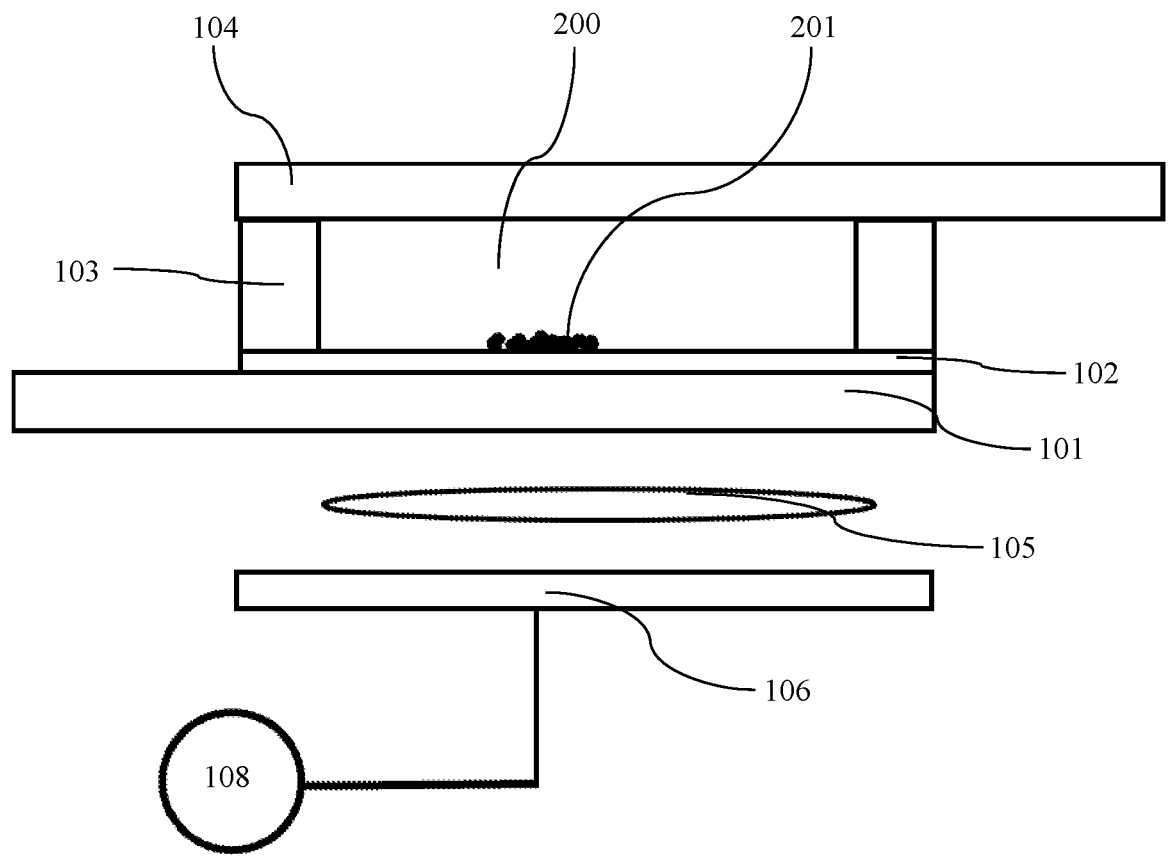
FIG. 4 shows a schematic diagram of nanoparticles adhesion in an embodiment of the invention.
Figure 6:
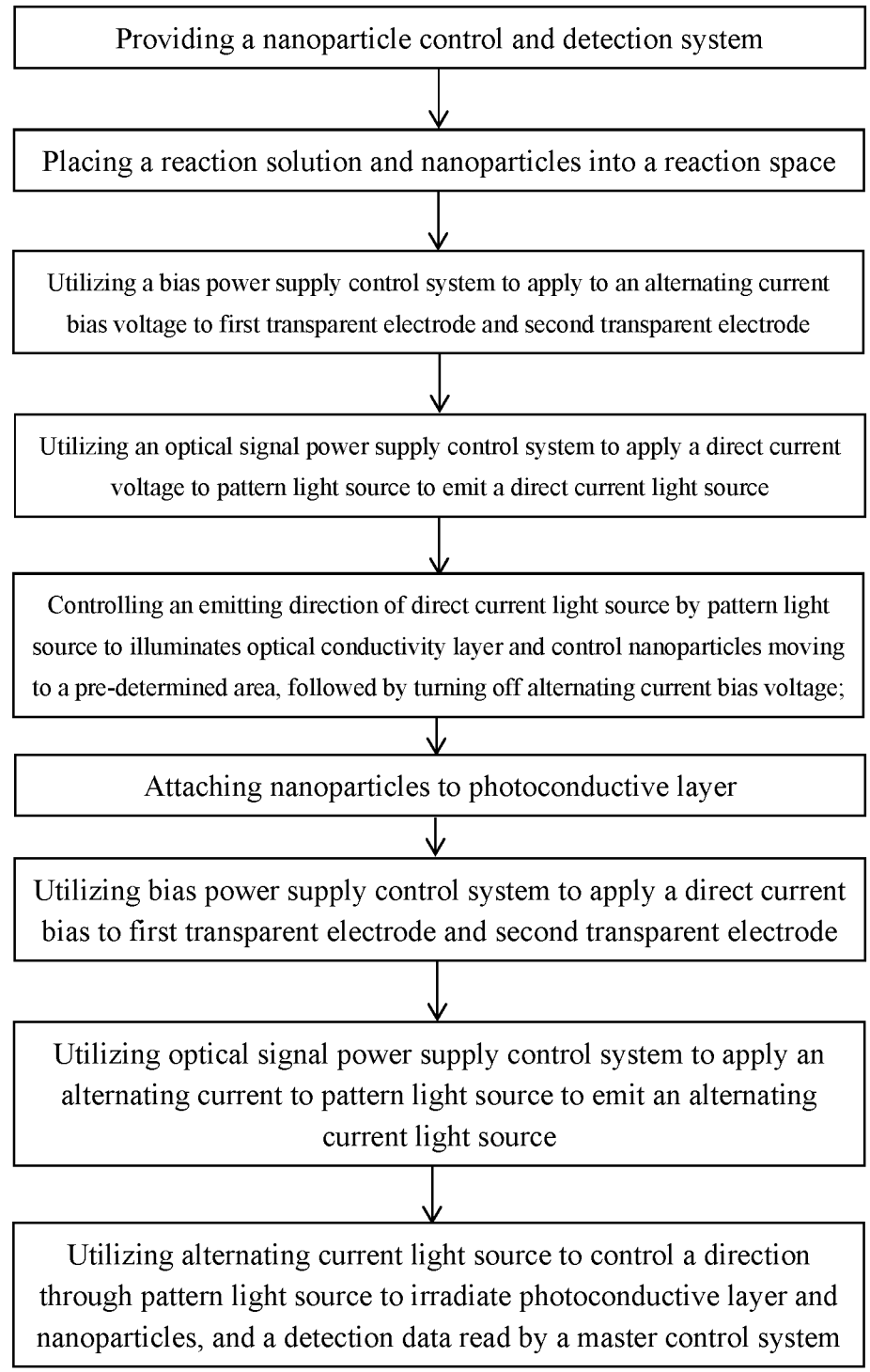
FIG. 6 illustrates a flow chart of the operation method of an embodiment of the present invention.

Please refer to FIG. 6, it illustrates a flowchart of the operation method of an embodiment of the present invention. As shown in FIG. 6, it describes the operation method of the nanoparticle control and detection system 10 used in this embodiment. For a better understanding of the application of the nanoparticle control and detection system 10 in the present embodiment, FIGS. 1-5 are referred at the same time. FIG. 1 is a schematic diagram of the structure of placing nanoparticles in an embodiment of the invention. FIG. 2 is a system architecture diagram of nanoparticles aggregation in an embodiment of the invention. FIG. 3 is a schematic diagram of nanoparticles movement in an embodiment of the invention. FIG. 4 is a schematic diagram of nanoparticles adhesion in an embodiment of the invention. FIG. 5 is a schematic diagram of the reaction result of nanoparticles detection according to one embodiment of the present invention.

In this embodiment, the operation method of the nanoparticle control and detection system 10 includes the following steps. Firstly, as shown in FIG. 2, the aforementioned nanoparticle control and detection system 10 is provided. Then, as shown in FIG. 1, a reaction solution and a plurality of nanoparticles 201 are added into the reaction space 200. In this embodiment, the nanoparticles 201 are magnetic bead, which can be used in biochemical detection. In one embodiment, it can also embed antibodies on the nanoparticles according to the requirement of detection reaction. When the user places the reaction solution and the nanoparticles 201 into the reaction space 200, the nanoparticles 201 will be dispersed in the reaction solution within the reaction space 200 due to density and other factors, as shown in FIG. 1.

Subsequently, as shown in FIG. 2, the bias power supply control system 107 applies an alternating current bias voltage to the first transparent electrode 101 and the second transparent electrode 104, and the optical signal power supply control system 108 applies a direct current voltage to the pattern light source 106, so that the pattern light source 106 emits a direct current light source L1. In this embodiment, the bias power supply control system 107 does not limit its construction components, and the effectiveness per se is to control and supply power. The type of power supply can be DC or AC, and it can be changed according to the user's requirement for detecting. Similarly, the optical signal power supply control system 108 plays a similar role for the pattern light source element 106. The function of the optical signal power supply control system 108 is to provide and control the type and strength of the output power supply of the pattern light source 106.

When the bias power supply control system 107 is applied AC bias voltage to the first transparent electrode 101 and the second transparent electrode 104 and the pattern light source 106 emits DC light source L1, the nanoparticles 201 are clustered onto the region of the DC light source L1 through the lens 105 irradiating to the reaction space 200 as shown in FIG. 2.

The theory is that when the photoconductive layer 102 is irradiated by the direct current light source L1, the irradiated area of the photoconductive layer 102 generates an impedance change and forms a non-uniform electric field. By this mechanism, dielectrophoresis force can be induced to manipulate nanoparticles 201. Accordingly, as shown in FIG. 3, when the DC light source L1 emitted by the pattern light source element 106 shifts to the position of the DC light source L1' to illuminates the optical conductivity layer 102 through the lens 105, and controls the plural nanoparticles 201 moving to the pre-determined position or area of the plural nanoparticles 201' at the measuring point along the arrow direction, the AC bias voltage is turned off. The nanoparticles 201 are attached to the photoconductive layer 102 as shown in FIG. 4.

From the results of FIG. 3-4, it is obvious that the user can use the pattern light source 106 to control the illumination direction, position, shape and area of the direct current light source L1 to guide the nanoparticle 201 to the area where it needs to be reacted and detected, and to form the pre-determined pattern shape. The advantages of this technique include that it can not destroy the confinement of reaction space 200, cause further errors due to reaction condition change, or contaminate the reaction solution in reaction space 200, and can freely control the pattern shape or region of nanoparticles 201 attached to photoconductive layer 102.

When the attached process of the nanoparticles 201 shown in FIG. 4 is finished, the reaction result and even the reaction process are to be detected, as shown in FIG. 5. In FIG. 5, the bias power supply control system 107 applies DC bias to the first transparent electrode 101 and the second transparent electrode 104. At the same time, the optical signal power supply control system 108 applies alternating current to the pattern light source 106, so that the pattern light source 106 emits an alternating current light source L2.

Finally, the alternating current light source L2 controls the direction through the pattern light source 106 to irradiate the photoconductive layer 102 and the nanoparticles 201. Accordingly, the detection data is read by the master control system 300. In the embodiment of FIG. 5, the hardware architecture of the bias power supply control system 107 of the present embodiment for detection or measurement is further disclosed.

The nanoparticle control and detection system 10 includes the master control system 300, which is connected with the bias power supply control system 107. In the embodiment of FIG. 5, the bias power supply control system 107 includes a data acquisition card 1071, a power supply 1072, an amplifier 1073 and a current sensor 1074.

The data acquisition card 1071 is connected with the master control system, and the power supply 1072 is connected with the data acquisition card 1071 and the second transparent electrode 104. The amplifier 1073 is connected to the data acquisition card 1071, and the current sensor 1074 is connected to the amplifier 1073 and the first transparent electrode 101.

In this embodiment, the power supply 1072 is supplied AC bias voltage to the first transparent electrode 101 and the second transparent electrode 104 during the phase shown in FIG. 1-4, while the power supply 1072 is supplied DC bias voltage to the first transparent electrode 101 and the second transparent electrode 104 for the detection in FIG. 5. In this example, the current sensor 1074 is implemented by an ammeter, and its measurement accuracy is mainly at least at the level of micro-ampere (µA).

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

What is claimed is:

1. A nanoparticle control and detection system, comprising:
   a first transparent electrode;
   a photoconductive layer arranged on said first transparent electrode;
   a spacer arranged along a periphery of said photoconductive layer to form a reaction space;
   a second transparent electrode arranged on said spacer;
   a lens arranged under said first transparent electrode;
   a pattern light source arranged under said lens so that said lens is located between said pattern light source and said first transparent electrode;
   a bias power supply control system connected with said first transparent electrode and said second transparent electrode; and
   an optical signal power supply control system connected with said pattern light source;
   a master control system, connected to said bias power supply control system and said optical signal power control system;
   wherein photoconductive layer comprises a first amorphous silicon layer and a second amorphous silicon layer, wherein said first amorphous silicon layer is arranged on said first transparent electrode and said second amorphous silicon layer is arranged on said first amorphous silicon layer;
   wherein said bias power supply control system comprises: a data acquisition card connected with the master control system; a power supply connected with said data acquisition card and said second transparent electrode; an amplifier connected to said data acquisition card; and a current sensor connected to said amplifier and said first transparent electrode.

2. The system of claim 1, wherein said reaction space is a reaction tank, a flow channel or the combination thereof.

3. The system of claim 1, wherein said first transparent electrode and said second transparent electrode are made of Indium Tin Oxide (ITO).

4. The system of claim 1, wherein a reaction solution and a plurality of nanoparticles are added into said reaction space.

5. The system of claim 4, wherein said plurality of nanoparticles are magnetic beads.

6. The system of claim 1, wherein said first amorphous silicon layer is made of high concentration doped N-type hydrogenated amorphous silicon (n+a-Si:H), and said second amorphous silicon layer is made of intrinsic hydrogenated amorphous silicon (Intrinsic a-Si: H).

7. The system of claim 1, wherein the master control system is further connected to a microscope camera.

8. An operation method of a nanoparticle control and detection system, comprising:
providing said nanoparticle control and detection system of claim 1;
placing a reaction solution and a plurality of nanoparticles into said reaction space;
utilizing said bias power supply control system to apply to an alternating current bias voltage to said first transparent electrode and said second transparent electrode;
utilizing said optical signal power supply control system to apply a direct current voltage to said pattern light source so that said pattern light source emits a direct current light source;
controlling an emitting direction of said direct current light source by said pattern light source to illuminates said optical conductivity layer and control said plurality of nanoparticles moving to a pre-determined position or area, followed by turning off said alternating current bias voltage;
attaching said plurality of nanoparticles to said photoconductive layer;
utilizing said bias power supply control system to apply a direct current bias to said first transparent electrode and said second transparent electrode;
utilizing said optical signal power supply control system to apply an alternating current to said pattern light source so that said pattern light source emits an alternating current light source; and
utilizing said alternating current light source to control a direction through said pattern light source to irradiate said photoconductive layer and said plurality of nanoparticles, and a detection data is read by a master control system.

\* \* \* \* \*